United States Patent
Lee et al.

(10) Patent No.: US 9,159,919 B2
(45) Date of Patent: Oct. 13, 2015

(54) VARIABLE RESISTANCE MEMORY DEVICE AND METHOD FOR FABRICATING THE SAME

(71) Applicant: SK hynix Inc., Gyeonggi-do (KR)

(72) Inventors: Sang-Keum Lee, Gyeonggi-do (KR);
Jae-Yun Yi, Gyeonggi-do (KR);
Dong-Hee Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 288 days.

(21) Appl. No.: 13/733,367

(22) Filed: Jan. 3, 2013

(65) Prior Publication Data
US 2013/0288391 A1    Oct. 31, 2013

(30) Foreign Application Priority Data
Apr. 26, 2012 (KR) .................... 10-2012-0043788

(51) Int. Cl.
| | |
|---|---|
| *H01L 27/00* | (2006.01) |
| *H01L 45/00* | (2006.01) |
| *H01L 27/22* | (2006.01) |
| *H01L 27/24* | (2006.01) |
| *H01L 43/08* | (2006.01) |

(52) U.S. Cl.
CPC ............. *H01L 45/16* (2013.01); *H01L 27/224* (2013.01); *H01L 27/249* (2013.01); *H01L 27/2409* (2013.01); *H01L 43/08* (2013.01); *H01L 45/06* (2013.01); *H01L 45/08* (2013.01); *H01L 45/1226* (2013.01); *H01L 45/144* (2013.01); *H01L 45/146* (2013.01); *H01L 45/147* (2013.01)

(58) Field of Classification Search
USPC .......................................... 438/128, 382; 257/4
See application file for complete search history.

(56) References Cited

U.S. PATENT DOCUMENTS

| | | | |
|---|---|---|---|
| 2011/0049646 A1* | 3/2011 | Lim et al. ................. | 257/410 |
| 2011/0104869 A1* | 5/2011 | Hyun et al. ............... | 438/430 |
| 2012/0147649 A1* | 6/2012 | Samachisa et al. ....... | 365/51 |
| 2013/0153852 A1* | 6/2013 | Park et al. ................. | 257/4 |
| 2013/0193395 A1* | 8/2013 | Lee ............................ | 257/4 |

\* cited by examiner

*Primary Examiner* — Jamie C Niesz
(74) *Attorney, Agent, or Firm* — IP & T Group LLP

(57) ABSTRACT

A variable resistance memory device includes vertical electrodes vertically projecting from a substrate, first horizontal electrodes stacked along the vertical electrodes, second horizontal electrodes stacked along the vertical electrodes, and a variable resistance layer interposed between the vertical electrodes and the first and second horizontal electrodes, wherein the first and second horizontal electrodes are arranged in directions crossing with each other.

9 Claims, 18 Drawing Sheets

VARIABLE RESISTANCE MEMORY DEVICE AND METHOD FOR FABRICATING THE SAME

CROSS-REFERENCE TO RELATED APPLICATIONS

The present application claims priority of Korean Patent Application No. 10-2012-0043788, filed on Apr. 26, 2012, which is incorporated herein by reference in its entirety.

BACKGROUND

1. Field

Exemplary embodiments of the present invention relate to a variable resistance memory device and a method for fabricating the same, and more particularly, to a variable resistance memory device with a three-dimensional structure including a plurality of memory cells vertically stacked from a substrate, and a method for fabricating the same.

2. Description of the Related Art

A variable resistance memory device refers to a device which stores data based on such a characteristic that switching function is implemented between different resistance states, each changed according to an external stimulus. The variable resistance memory device includes a resistive random access memory (ReRAM), a phase change RAM (PCRAM) and a spin transfer torque-RAM (STT-RAM). The variable resistance memory device has been researched since it can be formed to a simple structure. Also, the variable resistance memory device may have various excellent properties such as nonvolatility and so forth.

Among variable resistance memory devices, the ReRAM includes a variable resistance layer which is formed of a variable resistance substance, e.g., a perovskite-based substance or a transition metal oxide, and electrodes formed over and under the variable resistance layer. According to a voltage applied to an electrode, filament current paths are created or vanished in the variable resistance layer. When the variable resistance layer becomes a low resistance state, the filament current paths are created. Otherwise, if the variable resistance layer becomes a high resistance state, the filament current paths are vanished. Switching from the high resistance state to the low resistance state is referred to as a set operation. Conversely, switching from the low resistance state to the high resistance state is referred to as a reset operation.

Meanwhile, in order to improve the degree of integration of such a variable resistance memory device, the so-called cross point cell array structure has been suggested. The cross point cell array structure includes plural memory cells located at crossing points between a plurality of bit lines extending in one direction and a plurality of word lines extending in another direction crossing with the bit lines.

However, in order to form the cross point cell array structure, there are concerns in that fabrication processes may be complicated and the fabrication costs increase, because a plurality of mask processes should be repeated to pattern the bit lines and the word lines to a minimum critical dimension.

SUMMARY

Embodiments of the present invention are directed to a variable resistance memory device including electrodes to increase the integration degree of memory cells, which is formed by the decreased number of mask processes through simplified fabricating processes to reduce the fabrication cost, and a method for fabricating the same.

In accordance with an embodiment of the present invention, a variable resistance memory device may include: vertical electrodes vertically projecting from a substrate; first horizontal electrodes stacked along the vertical electrodes; second horizontal electrodes stacked along the vertical electrodes; and a variable resistance layer interposed between the vertical electrodes and the first and second horizontal electrodes, wherein the first and second horizontal electrodes are arranged in directions crossing with each other.

In accordance with another embodiment of the present invention, a method for fabricating a variable resistance memory device may include: alternately stacking a plurality of first interlayer dielectric layers and a plurality of first sacrificial layers on a substrate; defining first trenches which extend across the first interlayer dielectric layers and the first sacrificial layers in one direction; forming a first dielectric layer in the first trenches; selectively etching the first dielectric layer and defining first holes which expose the first sacrificial layers and the substrate; sequentially forming a first variable resistance layer and first vertical electrodes along sidewalls of the first holes; defining second trenches which extend across the first interlayer dielectric layers and the first sacrificial layers in the same direction as the first trenches, on both sides of the first trenches; removing the first sacrificial layers which are exposed through the second trenches; and forming first horizontal electrodes in spaces generated by removal of the first sacrificial layers.

In accordance with yet another embodiment of the present invention, a method for fabricating a variable resistance memory device may include: alternately stacking a plurality of first interlayer dielectric layers and a plurality of first sacrificial layers on a substrate; defining first trenches which extend across the first interlayer dielectric layers and the first sacrificial layers in one direction; forming a first dielectric layer in the first trenches; defining second trenches which extend across the first interlayer dielectric layers and the first sacrificial layers in the same direction as the first trenches, on both sides of the first trenches; removing the first sacrificial layers which are exposed through the second trenches; forming first horizontal electrodes in spaces generated by removal of the first sacrificial layers; selectively etching the first dielectric layer and defining first holes which expose the first horizontal electrodes and the substrate; and sequentially forming a first variable resistance layer and first vertical electrodes along sidewalls of the first holes.

According to above described embodiments, electrodes are commonly used to increase the integration degree of memory cells. The number of mask processes is decreased to simplify fabricating processes, and thus the fabrication cost is reduced.

DETAILED DESCRIPTION

Figure 1A:
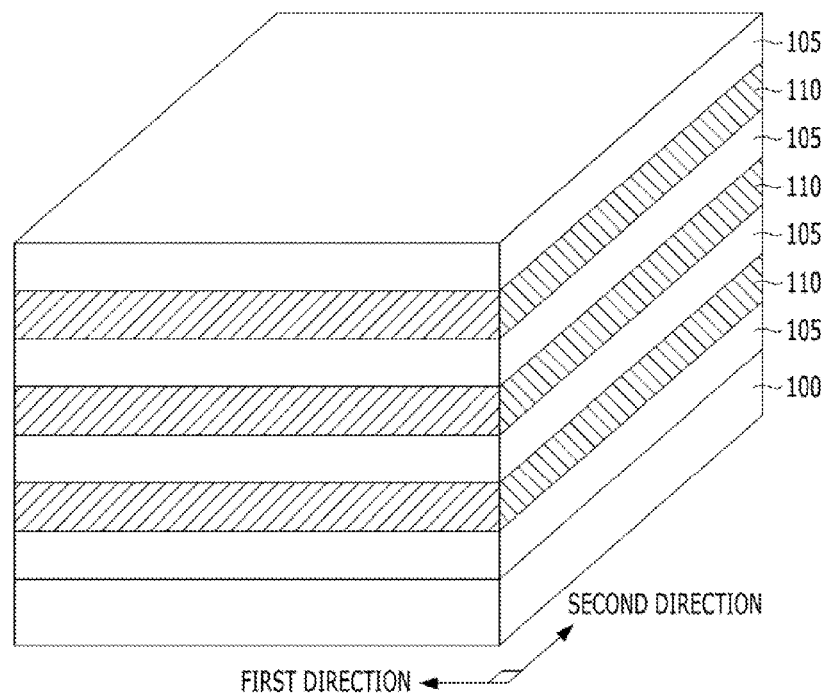
FIGS. 1A to 1J are perspective views explaining a variable resistance memory device and a method for fabricating the same in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
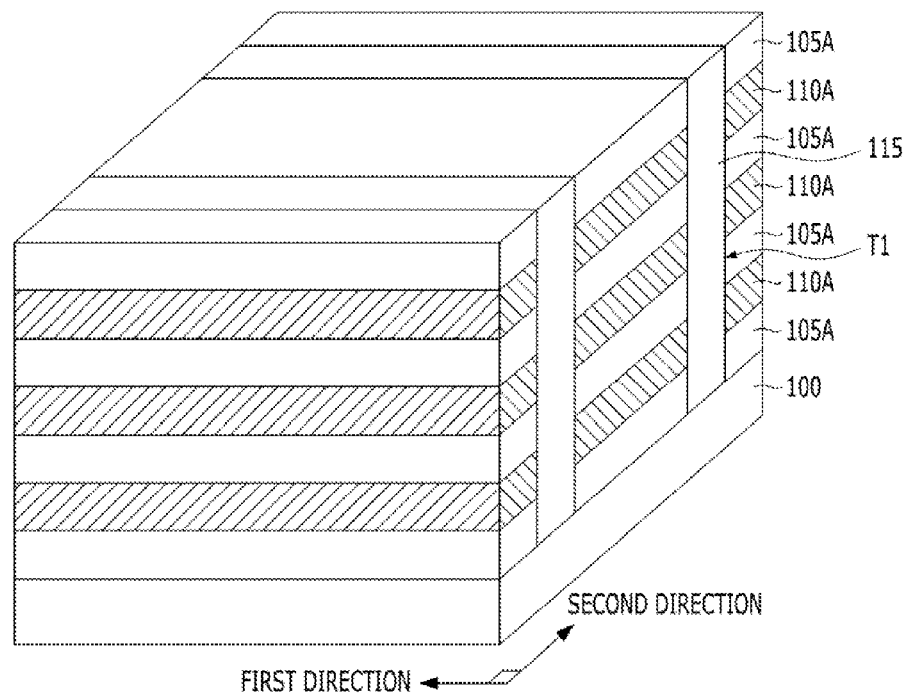
Figure 1C:
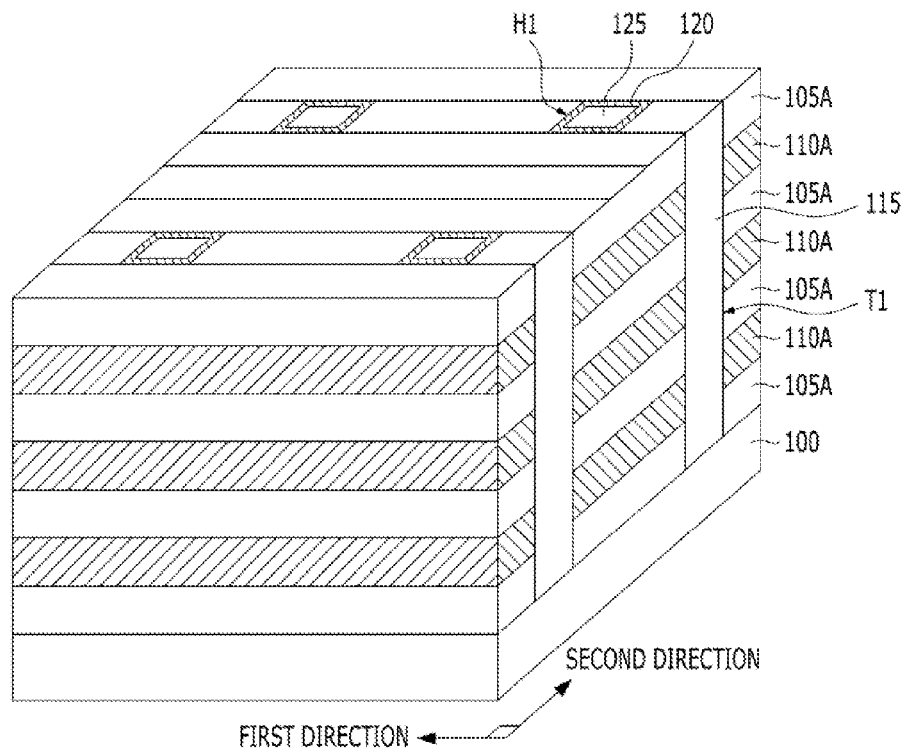
Figure 1D:
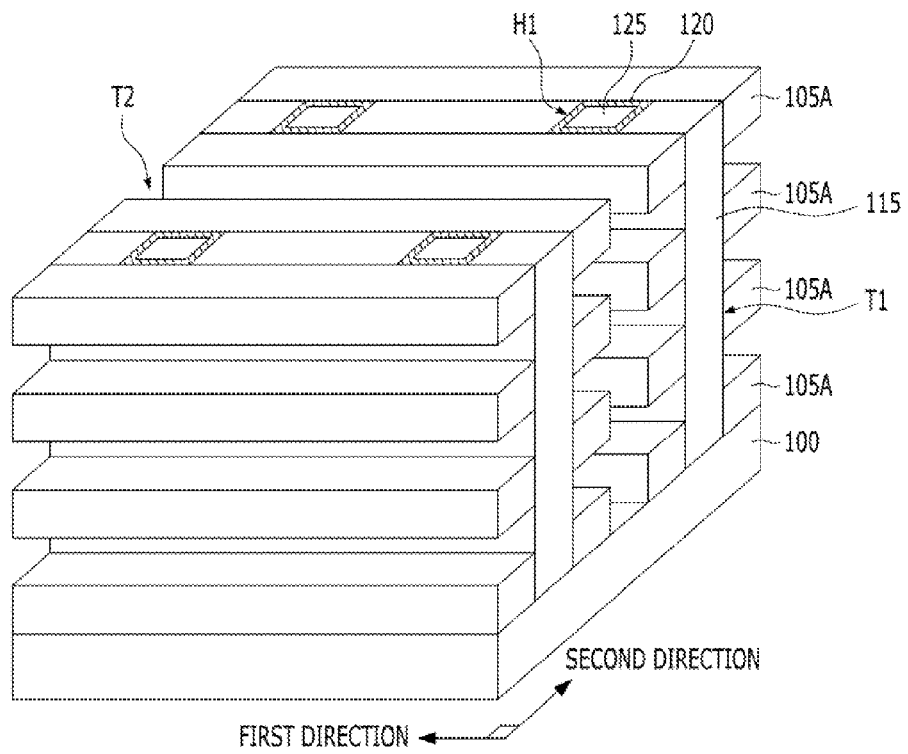
Figure 1E:
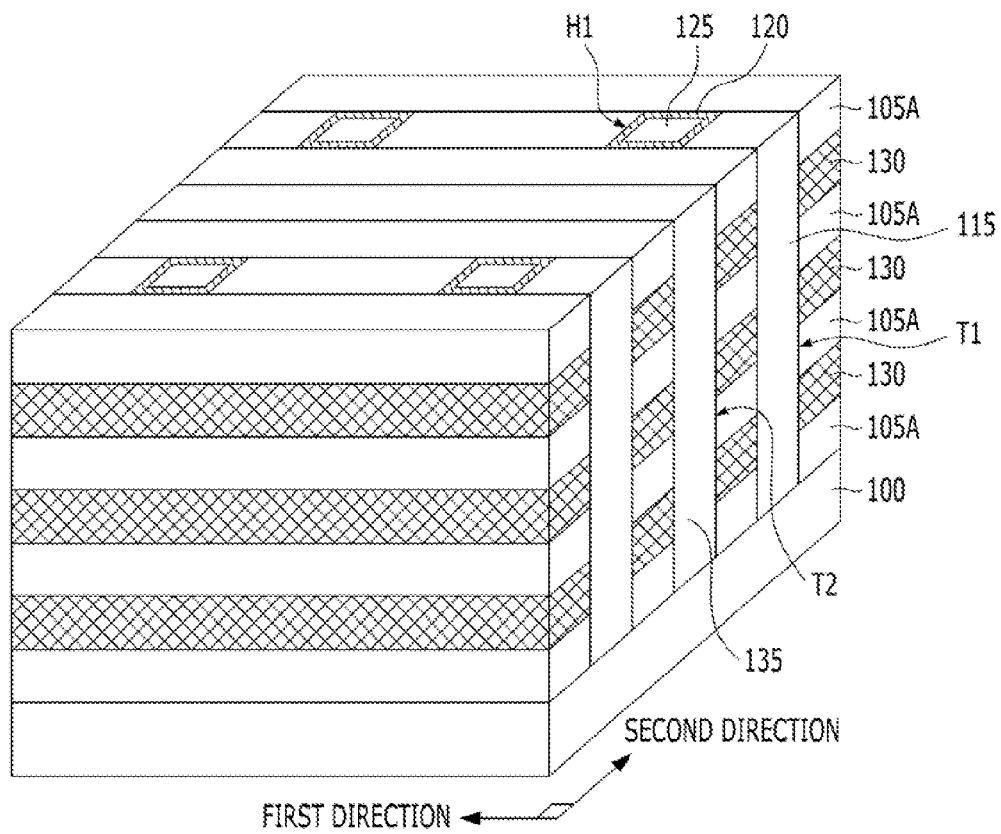
Figure 1F:
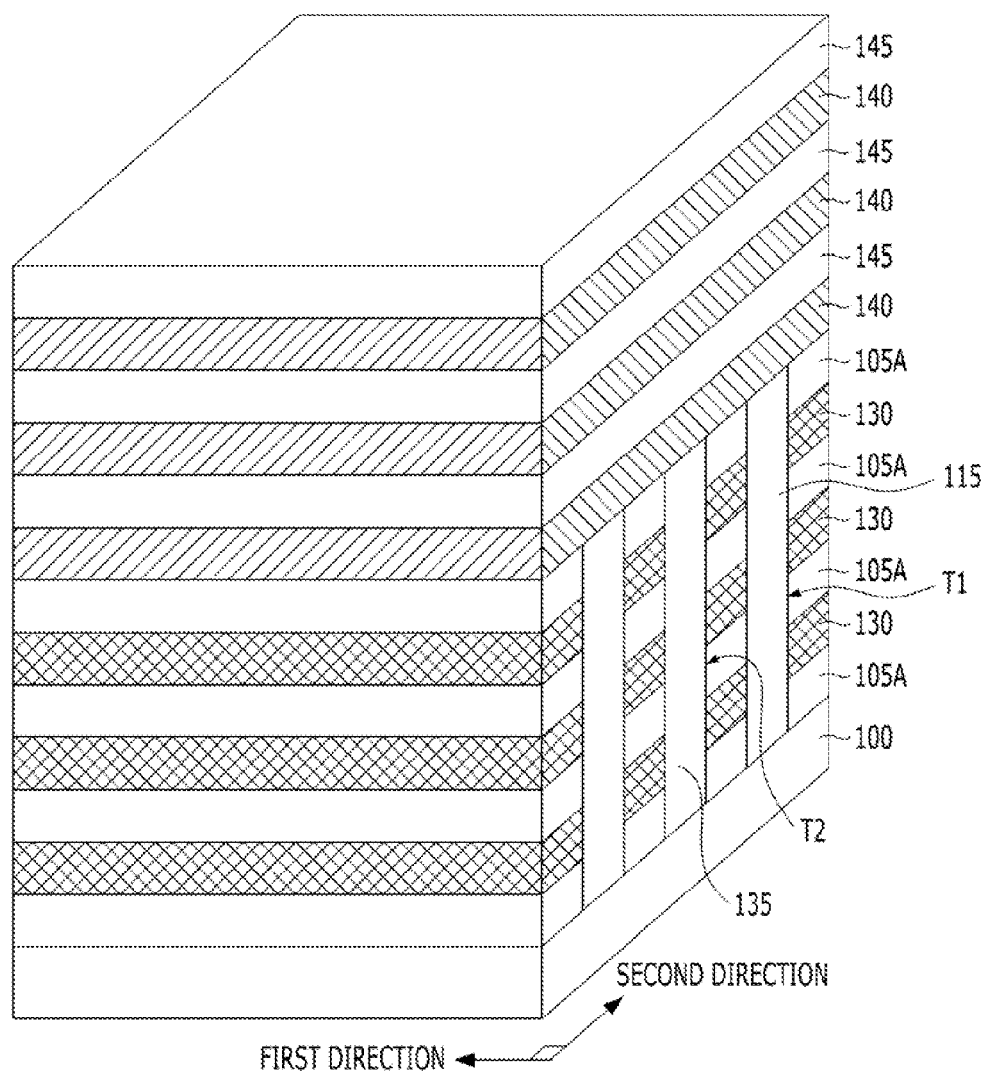
Figure 1G:
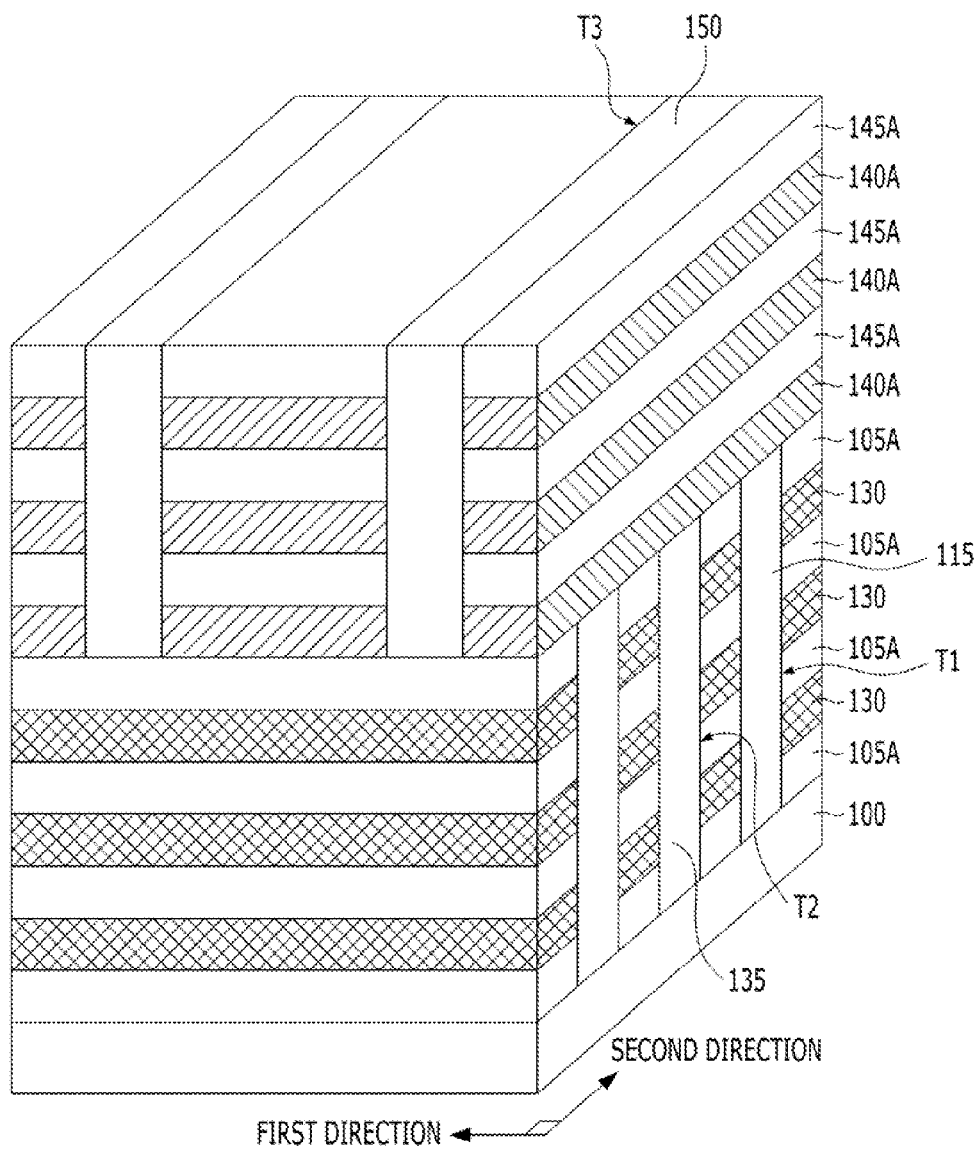
Figure 1H:
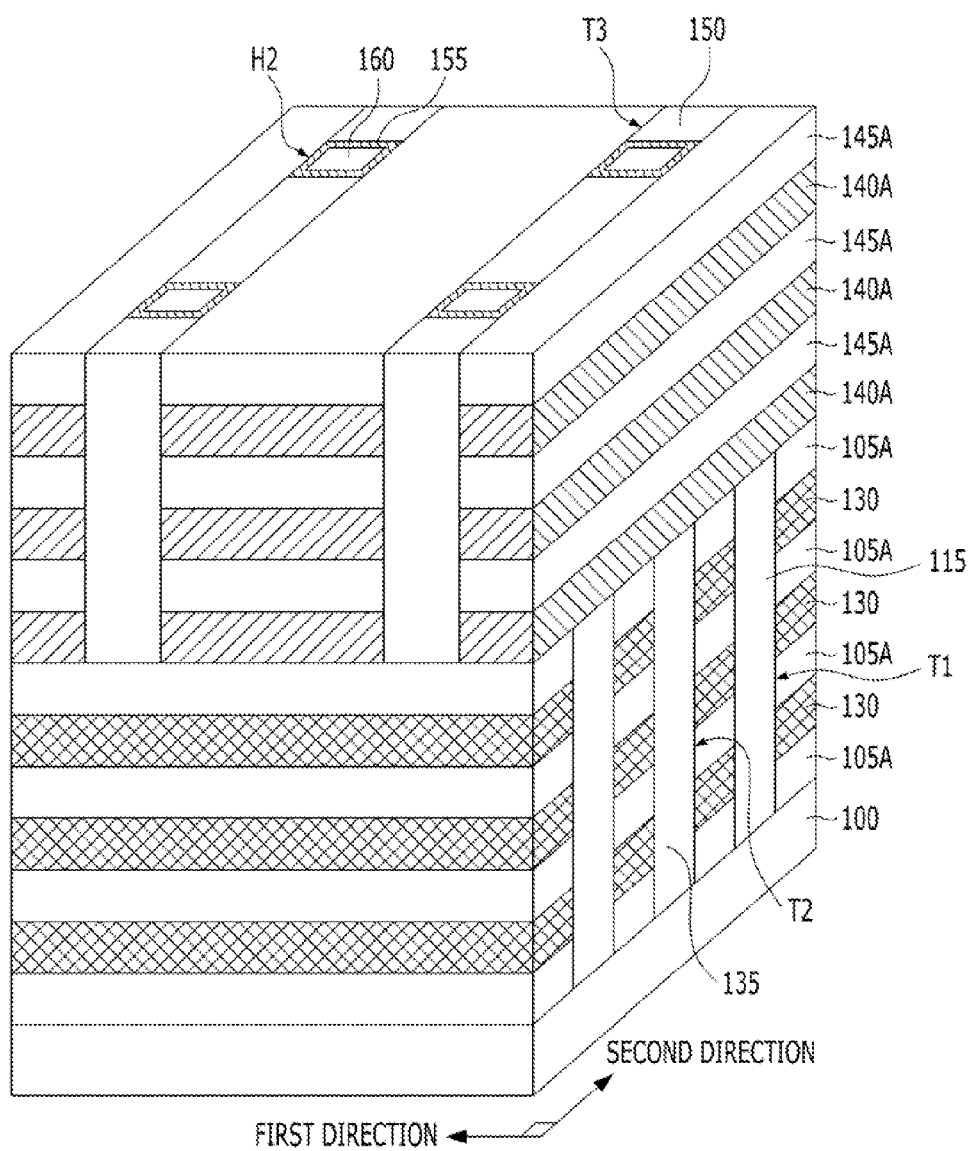
Figure 1I:
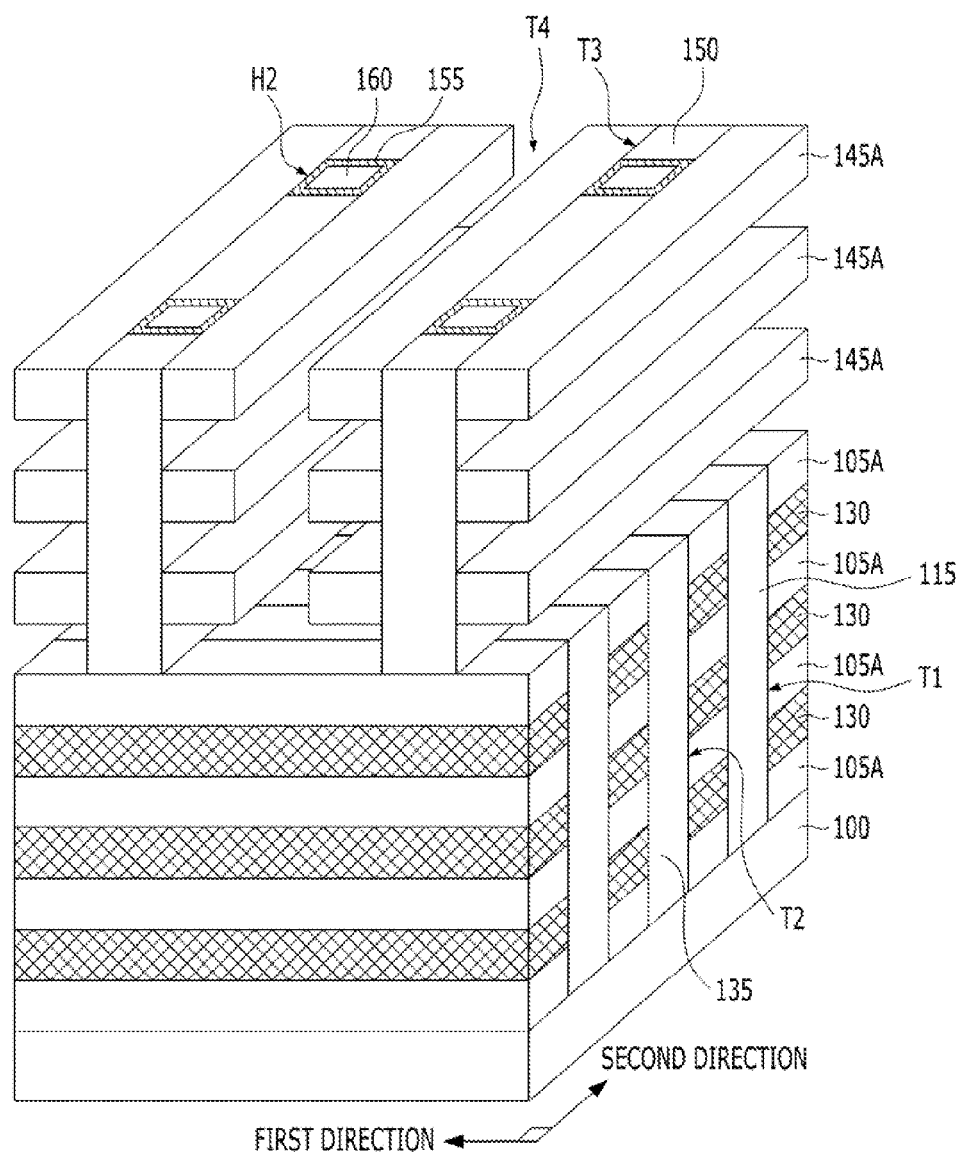
Figure 1J:
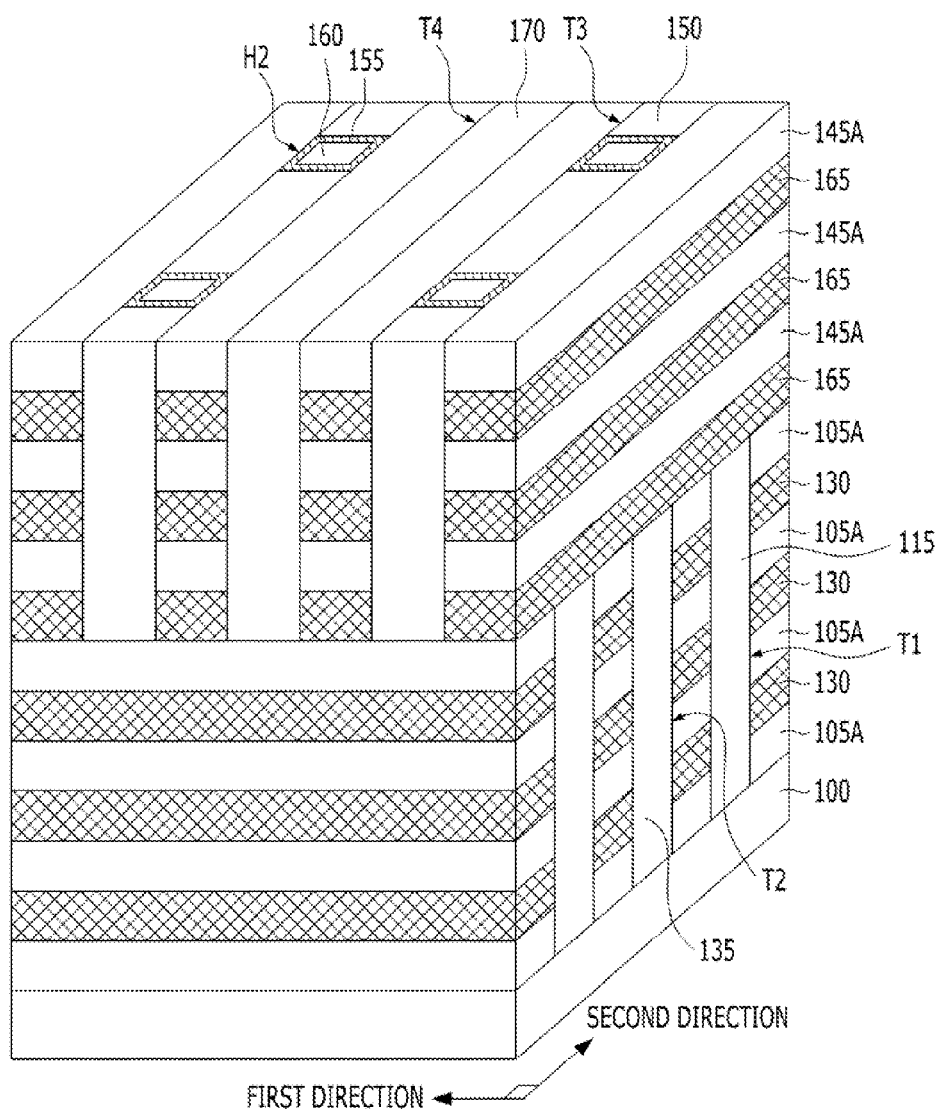

FIGS. 1A to 1J are perspective views explaining a variable resistance memory device and a method for fabricating the same in accordance with a first embodiment of the present invention. In particular, FIG. 1J is a perspective view illustrating the variable resistance memory device in accordance with the first embodiment of the present invention. FIGS. 1A to 1I are perspective views illustrating the processes of the method for fabricating the variable resistance memory device of FIG. 1J.

Referring to FIG. 1A, a plurality of first interlayer dielectric layers 105 and a plurality of first sacrificial layers 110 are alternately stacked on a substrate 100 with a predetermined underlying structure (not shown). The substrate 100 may be a semiconductor substrate formed of a substance such as monocrystalline silicon. The first interlayer dielectric layers 105 may be formed of an oxide-based substance.

The first sacrificial layers 110 are layers which are removed in a subsequent process to provide spaces for forming first horizontal electrodes. The first sacrificial layers 110 may be formed of a substance, e.g., a nitride-based material, with a different etching selectivity against the first interlayer dielectric layers 105. While three first sacrificial layers 110 are shown in the present cross-sectional view, three first sacrificial layers 110 are just for an illustration purpose. The number of first sacrificial layers 110 may be greater or less than three.

Referring to FIG. 1B, the first interlayer dielectric layers 105 and the first sacrificial layers 110 are etched using line-shaped mask patterns (not shown) used as etch masks. The line-shaped mask patterns extend in a first direction. Accordingly, first trenches T1 are defined. A plurality of first trenches T1 may be arranged parallel to one another. The first interlayer dielectric layers 105 and the first sacrificial layers 110 which remain after this process are respectively referred to as first interlayer dielectric layer patterns 105A and first sacrificial layer patterns 110A.

Then, a first dielectric layer 115 is formed in the first trenches T1. The first dielectric layer 115 may be formed by depositing a substance, e.g., an oxide-based substance, with a different etching selectivity against the first sacrificial layer patterns 110A to a thickness filling the first trenches T1 and then performing a planarization process such as chemical mechanical polishing (CMP) until the upper surfaces of the first interlayer dielectric layer patterns 105A are exposed.

Referring to FIG. 1C, by selectively etching the first dielectric layer 115, first holes H1 are defined in such a way as to expose the first sacrificial layer patterns 110A and the substrate 100. A plurality of first holes H1 may be arranged in a matrix type. The cross-sections of the first holes H1, which are taken in a direction parallel to the substrate 100, may have the shape of a square or a circle or the shape of a rectangle or an ellipse.

In succession, a first variable resistance layer 120 is formed on the sidewalls of the first holes H1. The first variable resistance layer 120 may include an electrical resistance changed by migration of oxygen vacancies or ions or phase change of a substance. Otherwise, the first variable resistance layer 120 may include a magnetic tunnel junction (MTJ) structure where electrical resistance changes according to a magnetic field or a spin transfer torque (STT).

The layer including electrical resistance changed by migration of oxygen vacancies or ions may include a perovskite-based substance, such as STO ($SrTiO_3$), BTO ($BaTiO_3$) and PCMO ($Pr_{1-x}Ca_xMnO_3$), or a binary oxide including a transition metal oxide (TMO) such as a titanium oxide ($TiO_2$), a hafnium oxide ($HfO_2$), a zirconium oxide ($ZrO_2$), an aluminum oxide ($Al_2O_3$), a tantalum oxide ($Ta_2O_5$), a niobium oxide ($Nb_2O_5$), a cobalt oxide ($Co_3O_4$), a nickel oxide (NiO), a tungsten oxide ($WO_3$), and a lanthanum oxide ($La_2O_3$). The layer including electrical resistance changed by phase change of a substance may include a substance, which is changed between a crystalline state and an amorphous state by heat, like a chalcogenide-based substance such as GST (GeSbTe) including germanium, antimony and tellurium mixed at a predetermined ratio.

The magnetic tunnel junction (MTJ) structure may include a free ferromagnetic layer, a pinned ferromagnetic layer, and a barrier layer interposed therebetween. The free ferromagnetic layer and the pinned ferromagnetic layer may include a ferromagnetic substance, for example, ferrum (Fe), nickel (Ni), cobalt (Co) gadolinium (Gd), dysprosium (Dy), or a compound thereof. The barrier layer may include a magnesium oxide (MgO), an aluminum oxide ($Al_2O_3$), a hafnium oxide ($HfO_2$), a zirconium oxide ($ZrO_2$), or a silicon oxide ($SiO_2$).

Thereafter, first vertical electrodes 125 are formed in the first holes H1 where the first variable resistance layer 120 is formed. The first vertical electrodes 125 may include a conductive substance like a doped polysilicon, a metal nitride, or a metal. The metal nitride may include a titanium nitride (TIN), a tantalum nitride (TaN), and a tungsten nitride (WN). The metal may include tungsten (W), aluminum (Al) copper (Cu), gold (Au), silver (Ag), platinum (Pt), nickel (Ni), chrome (Cr), cobalt (Co), titanium (Ti), ruthenium (Ru), hafnium (Hf), and zirconium (Zr).

Referring to FIG. 1D, the first interlayer dielectric layer patterns 105A and the first sacrificial layer patterns 110A on both sides of the first trenches T1 are etched based on line-shaped mask patterns (not shown) used as etch masks. The line-shaped mask patterns extend in the same direction as the first trenches T1. Accordingly, second trenches T2 are defined. A plurality of second trenches T2 may be arranged parallel to one another.

Next, the first sacrificial layer patterns 110A exposed through the second trenches T2 are removed. In order to remove the first sacrificial layer patterns 110A a wet etching process using a different etching selectivity against the first interlayer dielectric layer patterns 105A and the first dielectric layer 115 may be performed.

Referring to FIG. 1E, first horizontal electrodes 130 are formed in spaces from which the first sacrificial layer patterns 110A are removed. The first horizontal electrodes 130 may include a conductive substance, e.g., a metal nitride, a metal, or a doped polysilicon. The metal nitride may include a titanium nitride (TiN), a tantalum nitride (Tali), and a tungsten nitride (WN). The metal may include tungsten (W), aluminum (Al), copper (Cu), gold (Au), silver (Ag), platinum (Pt), nickel (Ni), chrome (Cr), cobalt (Co), titanium (Ti), ruthenium (Ru), hafnium (Hf), and zirconium (Zr).

In detail, the formation of the first horizontal electrodes 130 may be performed as follows. First, by conformally depositing a conductive substance through chemical vapor deposition (CVD) or atomic layer deposition (ALD), a conductive layer (not shown) for first horizontal electrodes is formed to fill the second trenches T2 including the spaces from which the first sacrificial layer patterns 110A are removed. Second, by etching the conductive layer for first horizontal electrodes formed in the second trenches T2 until the side surfaces of the first interlayer dielectric layer patterns 105A are exposed, the conductive layer for first horizontal electrodes is separated by the second trenches T2. As a result of this process, the first horizontal electrodes 130 are formed between the first interlayer dielectric layer patterns 105A.

Thereupon, a second dielectric layer 135 is formed in the second trenches T2. The second dielectric layer 135 may be formed by depositing a substance, e.g., an oxide-based substance, with a different etching selectivity against a second sacrificial layer to fill the second trenches T2. Then, a planarization process such as chemical mechanical polishing (CMP) is performed until the upper surfaces of the first interlayer dielectric layer patterns 105A are exposed.

Referring to FIG. 1F, a plurality of second sacrificial layers 140 and a plurality of second interlayer dielectric layers 145 are alternately stacked on the resultant structure including the second dielectric layer 135. The second interlayer dielectric layers 145 may be formed of an oxide-based substance.

The second sacrificial layers 140 are removed in a subsequent process to provide spaces for forming second horizontal electrodes. The second sacrificial layers 140 may be formed of a substance, e.g., a nitride-based substance, with a different etching selectivity against the second interlayer dielectric layers 145. While three second sacrificial layers 140 are shown in the present cross-sectional view, the three second sacrificial layers 140 are just for an illustration purpose. The number of second sacrificial layers 140 may greater or less than three.

Referring to FIG. 1G the second interlayer dielectric layers 145 and the second sacrificial layers 140 are etched based on line-shaped mask patterns (not shown) used as etch masks. The line-shaped mask patterns extend in a direction crossing with the first trenches T1, i.e., a second direction. Accordingly, third trenches T3 are defined. A plurality of third trenches T3 may be arranged parallel to one another. The second sacrificial layers 140 and the second interlayer dielectric layers 145, which remain after this process, are respectively referred to as second sacrificial layer patterns 140A and second interlayer dielectric layer patterns 145A.

Then, a third dielectric layer 150 is formed in the third trenches T3. The third dielectric layer 150 may be formed by depositing a substance, e.g., an oxide-based substance, with a different etching selectivity against the third sacrificial layer patterns 140A to fill the third trenches T3. Then, a planarization process such as chemical mechanical polishing (CMP) is performed until the upper surfaces of the second interlayer dielectric layer patterns 145A are exposed.

Referring to FIG. 1H, by selectively etching the third dielectric layer 150, second holes H2 are defined in such a way as to expose the second sacrificial layer patterns 140A and the first vertical electrodes 125. A plurality of second holes H2 may be arranged in a matrix type. The cross-sections of the second holes H2 which are taken in the direction parallel to the substrate 100 may have the shape of a square, a circle, a rectangle, or an ellipse. In particular, a process margin may be sufficiently secured by defining the second holes H2 to have a width larger than that of the first holes H1 in the direction parallel to the substrate 100.

In succession, a second variable resistance layer 155 is formed on the sidewalls of the second holes H2. The second variable resistance layer 155 may include electrical resistance changed by migration of oxygen vacancies or ions or phase change of a substance. Otherwise, the second variable resistance layer 155 may include a magnetic tunnel junction (MTJ) structure including electrical resistance changed according to a magnetic field or a spin transfer torque (STT). The second variable resistance layer 155 may be formed of the same substance as the first variable resistance memory device 120.

Thereafter, second vertical electrodes 160 are formed in the second holes H2 where the second variable resistance layer 155 is formed, in order to be connected with the first vertical electrodes 125. The second vertical electrodes 160 may include a conductive substance such as a metal nitride, a metal, or a doped polysilicon. The second vertical electrodes 160 may be formed of the same substance as the first vertical electrodes 125.

Referring to FIG. 1I, the second interlayer dielectric layer patterns 145A and the second sacrificial layer patterns 140A on both sides of the third trenches T3 are etched based on line-shaped mask patterns (not shown) used as etch masks. The line-shaped mask patterns extend in the same direction as the third trenches T3. Accordingly, fourth trenches T4 are defined. A plurality of fourth trenches T4 may be arranged parallel to one another.

Next, the second sacrificial layer patterns 140A which are exposed through the fourth trenches T4 are removed. In order to remove the second sacrificial layer patterns 140A a wet etching process using a different etching selectivity against the first and second interlayer dielectric layer patterns 105A and 145A and the first to third dielectric layers 115, 135 and 150 may be performed.

Referring to FIG. 1J, second horizontal electrodes 165 are formed in spaces from which the second sacrificial layer patterns 140A are removed. The second horizontal electrodes 165 may include a conductive substance such as a metal nitride, a metal, or a doped polysilicon. The second horizontal electrodes 165 may be formed of the same substance as the first horizontal electrodes 130.

In detail, the formation of the second horizontal electrodes 165 may be performed as follows. First, by conformally depositing a conductive substance through chemical vapor deposition (CVD) or atomic layer deposition (ALD), a conductive layer (not shown) for second horizontal electrodes is formed to fill the fourth trenches T4 including the spaces where the second sacrificial layer patterns 140A are removed. Second, by etching the conductive layer for second horizontal electrodes formed in the fourth trenches T4 until the side surfaces of the second interlayer dielectric layer patterns 145A are exposed, the conductive layer for second horizontal electrodes is separated by the fourth trenches T4. As a result of this process, the second horizontal electrodes 165 are formed between the second interlayer dielectric layer patterns 145A.

Thereupon, a fourth dielectric layer 170 is formed in the fourth trenches T4. The fourth dielectric layer 170 may be formed by depositing a dielectric substance, e.g., an oxide-based substance, to fill the fourth trenches T4. Then, a planarization process such as chemical mechanical polishing (CMP) is performed until the upper surfaces of the second interlayer dielectric layer patterns 145A are exposed.

While it is shown in FIG. 1J that horizontal electrodes (see the first and second horizontal electrodes 130 and 165) are stacked as six layers, the present invention is not limited to such horizontal electrodes. The number of stacked horizontal electrodes may be greater or less than six. In particular, by forming vertical electrodes (see the first and second vertical electrodes 125 and 160) by at least two layers, the degree integration of memory cells may increase and the degree of processing difficulty may be decreased, compared with conventional memory cells including vertical electrodes formed in the same height at once.

Also, by forming the first and second horizontal electrodes 130 and 165 which extend in different directions crossing with each other, advantages are provided in that surrounding circuits may be efficiently disposed. The first and second horizontal electrodes 130 and 165 may be formed to be alternately disposed. In this case, the parasitic capacitance between the horizontal electrodes may be reduced. The operation speed of the variable resistance memory device may be improved.

By the fabrication method as described above, the variable resistance memory device in accordance with the first embodiment of the present invention as shown in FIG. 1J may be fabricated.

Referring to FIG. 1J, the variable resistance memory device in accordance with the first embodiment may include the first vertical electrodes 125 which vertically project from the substrate 100 the plurality of first interlayer dielectric layer patterns 105A and the plurality of horizontal electrodes 130 which are alternately stacked along the first vertical electrodes 125, the first variable resistance layer 120 which is interposed between the first vertical electrodes 125 and the first horizontal electrodes 130, the second vertical electrodes 160 which are connected with the first vertical electrodes 125 and extend in the direction perpendicular to the substrate 100, the plurality of second interlayer dielectric layer patterns 145A and the plurality of second horizontal electrodes 165 which are alternately stacked along the second vertical electrodes 160, and the second variable resistance layer 155 which is interposed between the second vertical electrodes 160 and the second horizontal electrodes 165.

The first horizontal electrodes 130 and the second horizontal electrodes 165 may extend in the directions crossing with each other. Respective pairs of the first horizontal electrodes 130 and the second horizontal electrodes 165 may extend parallel with the first and second vertical electrodes 125 and 160 interposed therebetween. The cross-sections of the first and second vertical electrodes 125 and 160 which are taken in the direction parallel to the substrate 100 may have the shape of a rectangle or an ellipse. The side surfaces of the second vertical electrodes 160 may project sideward when compared to the side surfaces of the first vertical electrodes 125.

The first and second variable resistance layers 120 and 155 may include electrical resistance changed by migration of oxygen vacancies or ions or phase change of a substance. Otherwise, the first and second variable resistance layers 120 and 155 may include the magnetic tunnel junction (MTJ) structure in which electrical resistance changes according to a magnetic field or a spin transfer torque (STT). The first and second variable resistance layers 120 and 155 may have shapes which surround the side surfaces of the first and second vertical electrodes 125 and 160.

Figure 2A:
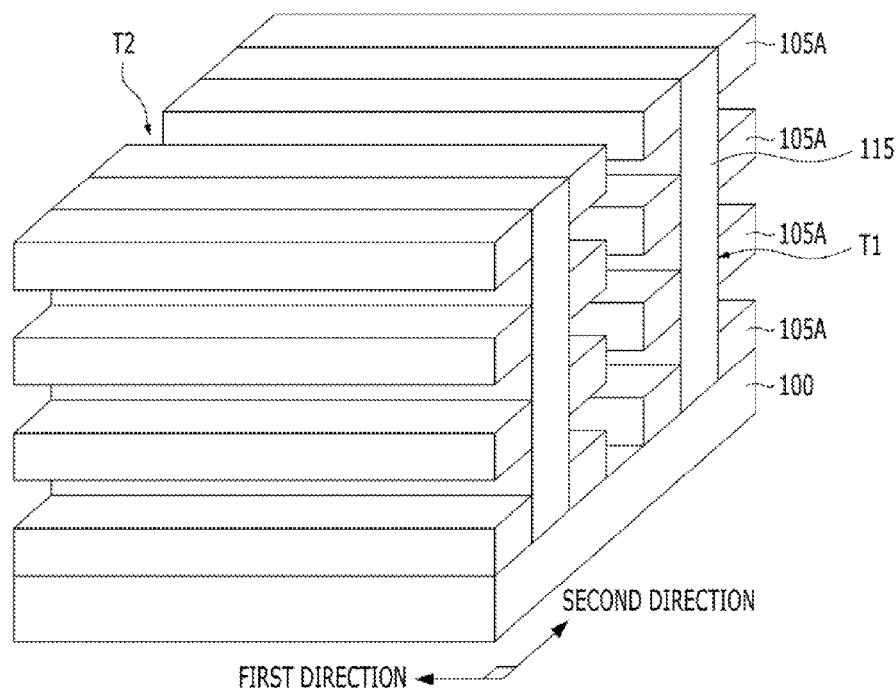
FIGS. 2A to 2H are perspective views explaining a variable resistance memory device and a method for fabricating the same in accordance with a second embodiment of the present invention.

FIGS. 2A to 2H are perspective views explaining a variable resistance memory device and a method for fabricating the same in accordance with a second embodiment of the present invention. In describing the present embodiment, detailed descriptions for substantially the same component parts as the aforementioned first embodiment will be omitted. First after performing the processes of FIGS. 1A and 1B in the same manner as the first embodiment, the process of FIG. 2A is performed.

Referring to FIG. 2A, the first interlayer dielectric layer patterns 105A and the first sacrificial layer patterns 110A on both sides of the first trenches T1 are etched using line-shaped mask patterns (not shown) used as etch masks. The line-shaped mask patterns extend in the same direction as the first trenches T1. Accordingly, second trenches T2 are defined. A plurality of second trenches T2 may be arranged parallel to one another.

Next, the first sacrificial layer patterns 110A which are exposed through the second trenches T2 are removed. In order to remove the first sacrificial layer patterns 110A, a wet etching process using a different etching selectivity against the first interlayer dielectric layer patterns 105A and the first dielectric layer 115 may be performed.

Figure 2B:
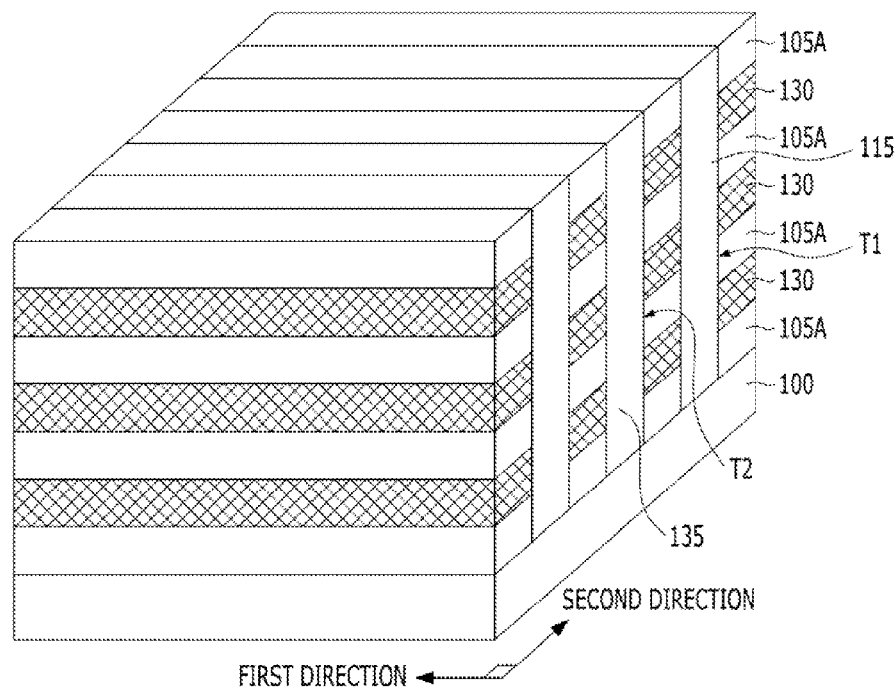

Referring to FIG. 2B, first horizontal electrodes 130 are formed in spaces from which the first sacrificial layer patterns 110A are removed. The first horizontal electrodes 130 may include a conductive substance, for example, a metal nitride, a metal or a doped polysilicon. The first horizontal electrodes 130 may be formed such that, by conformally depositing a conductive substance through chemical vapor deposition (CVD) or atomic layer deposition (ALD), a conductive layer (not shown) for first horizontal electrodes is formed to fill the second trenches T2 including the spaces from which the first sacrificial layer patterns 110A are removed, and the conductive layer for first horizontal electrodes is etched until the side surfaces of the first interlayer dielectric layer patterns 105A are exposed.

Thereupon, a second dielectric layer 135 is formed in the second trenches T2. The second dielectric layer 135 may be formed by depositing a substance, e.g., an oxide-based substance, with a different etching selectivity against a second sacrificial layer, to fill the second trenches T2. Then, a planarization process such as chemical mechanical polishing (CMP) is performed until the upper surfaces of the first interlayer dielectric layer patterns 105A are exposed.

Figure 2C:
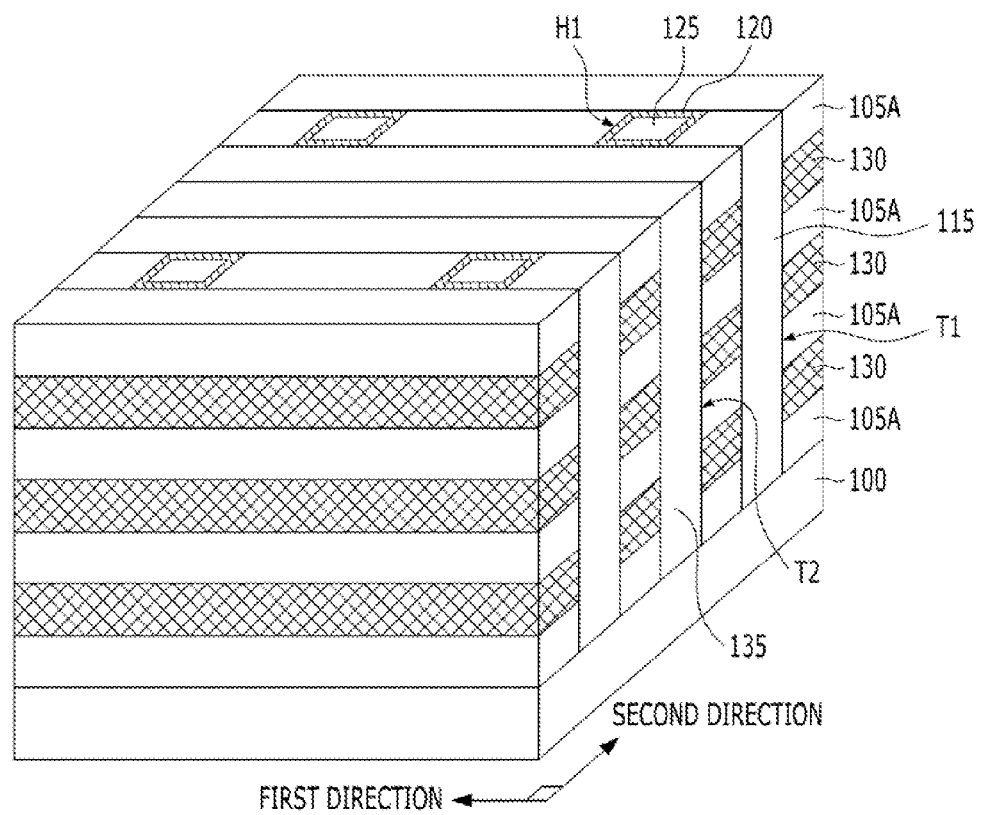

Referring to FIG. 2C, by selectively etching the first dielectric layer 115, first holes H1 are defined to expose the first horizontal electrodes 130 and the substrate 100. A plurality of first holes H1 may be arranged in a matrix type. The cross-sections of the first holes H1 which are taken in a direction parallel to the substrate 100 may have the shape of a square, a circle, a rectangle, or an ellipse.

In succession, a first variable resistance layer 120 is formed on the sidewalls of the first holes H1. The first variable resistance layer 120 may include electrical resistance changed by migration of oxygen vacancies or ions or phase change of a substance. Otherwise, the first variable resistance layer 120 may include a magnetic tunnel junction (MTJ) structure having electrical resistance changed according to a magnetic field or a spin transfer torque (STT).

Thereafter, first vertical electrodes 125 are formed in the first holes H1 where the first variable resistance layer 120 is formed. The first vertical electrodes 125 may include a conductive substance such as a metal nitride, a metal, or a doped polysilicon.

Figure 2D:
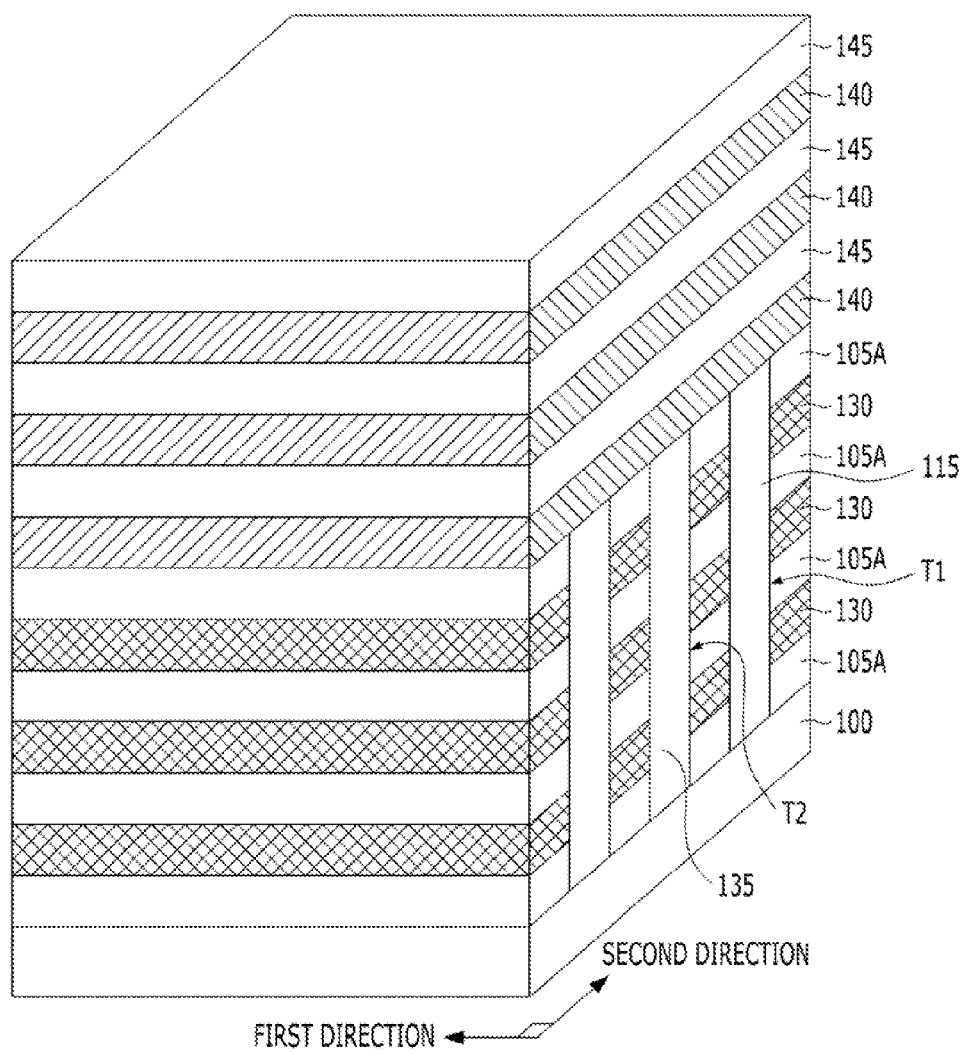

Referring to FIG. 2D, a plurality of second sacrificial layers 140 and a plurality of second interlayer dielectric layers 145 are alternately stacked on the resultant structure including the first vertical electrodes 125. The second interlayer dielectric layers 145 may be formed of an oxide-based substance. The second sacrificial layers 140 are removed in a subsequent process to provide spaces for forming second horizontal electrodes. The second sacrificial layers 140 may be formed of a substance e.g. a nitride-based substance, with a different etching selectivity against the second interlayer dielectric layers 145.

Figure 2E:
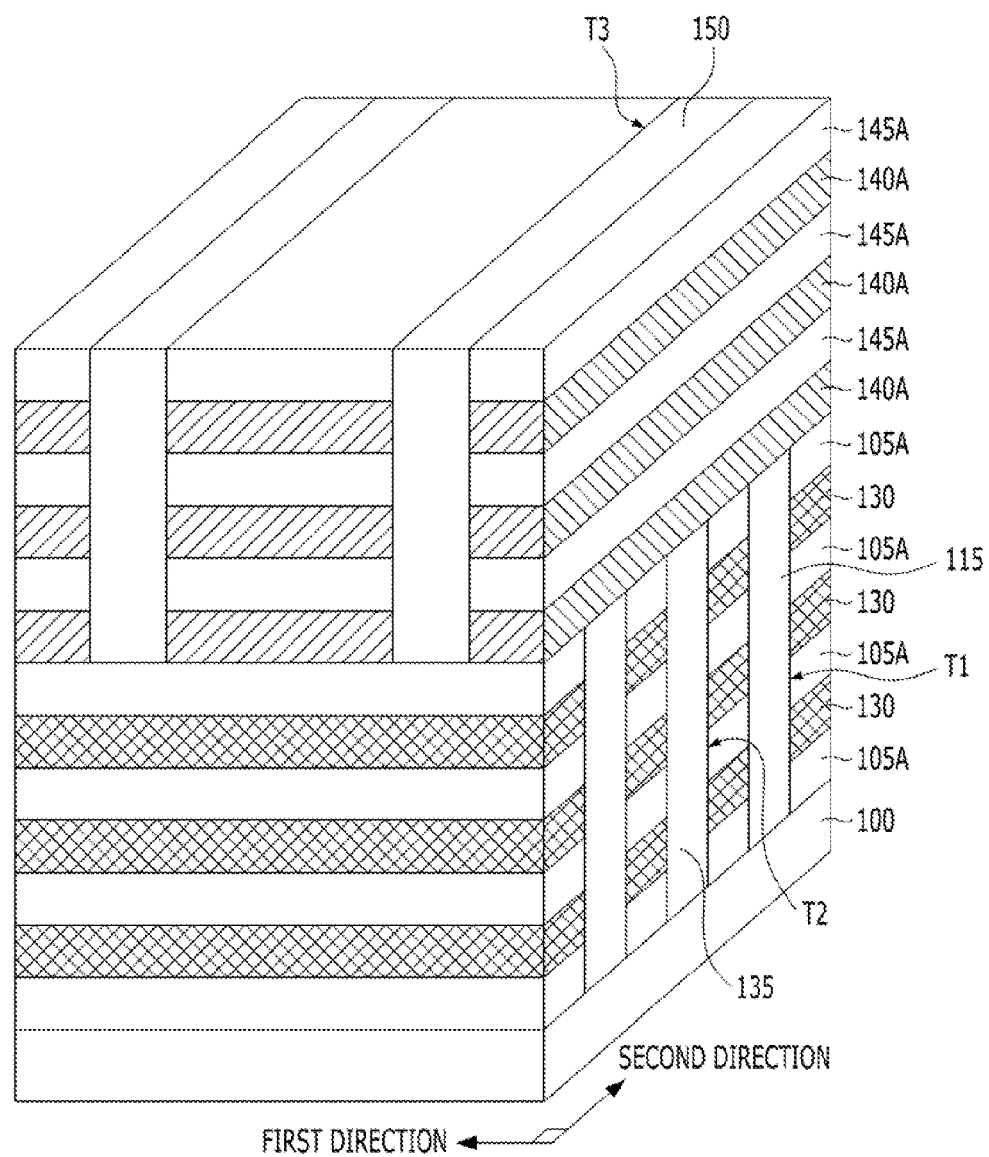

Referring to FIG. 2E, the second interlayer dielectric layers 145 and the second sacrificial layers 140 are etched based on line-shaped mask patterns (not shown) used as etch masks. The line-shaped mask patterns extend in a direction crossing with the first trenches T1, i.e., a second direction. Accordingly, third trenches T3 are defined. A plurality of third trenches T3 may be arranged parallel to one another. The second sacrificial layers 140 and the second interlayer dielectric layers 145 which remain after this process are respectively referred to as second sacrificial layer patterns 140A and second interlayer dielectric layer patterns 145A.

Then, a third dielectric layer 150 is formed in the third trenches T3. The third dielectric layer 150 may be formed by depositing a substance, e.g., an oxide-based substance, with a different etching selectivity against the second sacrificial layer patterns 140A to fill the third trenches T3. Then, a planarization process such as chemical mechanical polishing (CMP) is performed until the upper surfaces of the second interlayer dielectric layer patterns 145A are exposed.

Figure 2F:
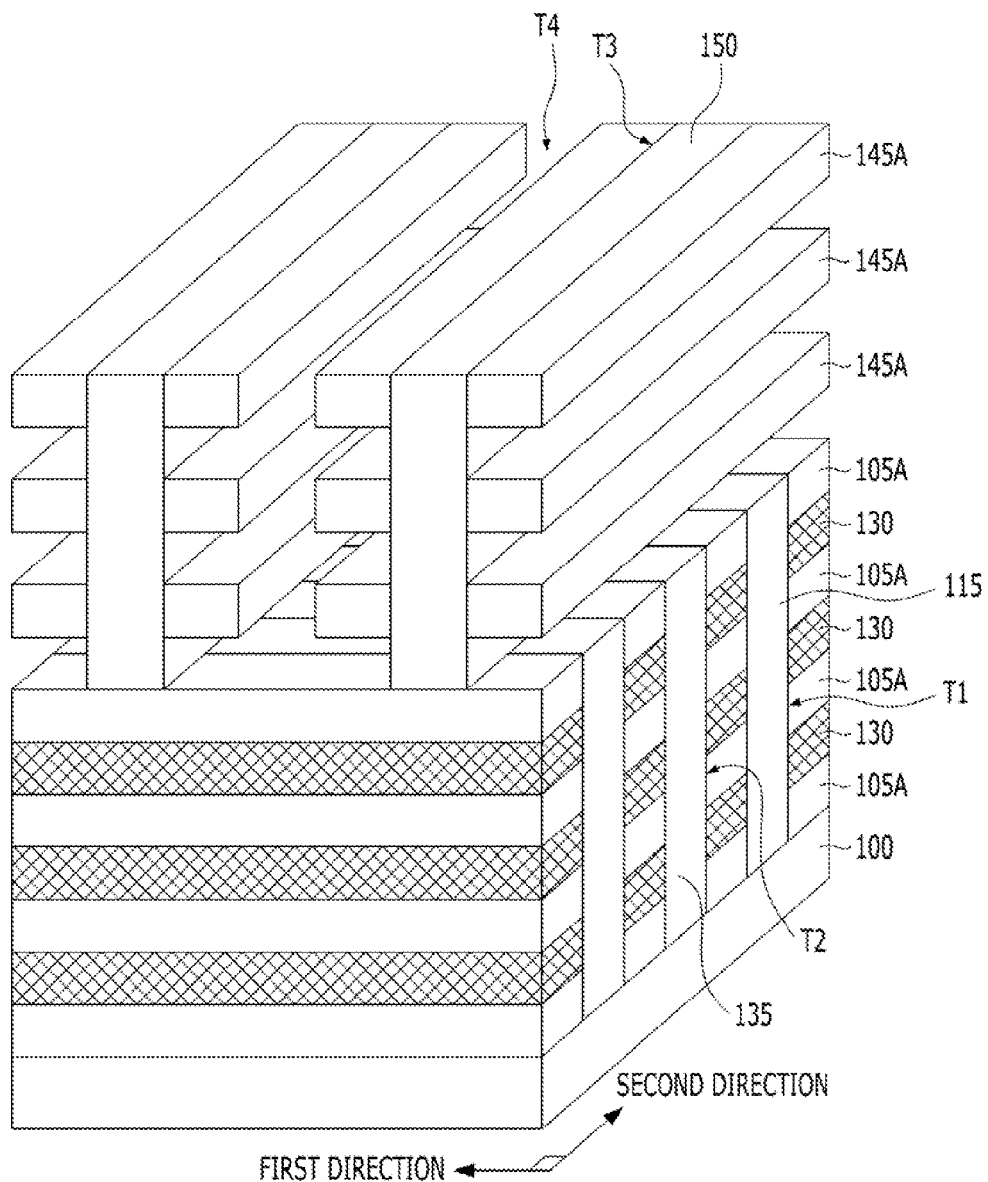

Referring to FIG. 2F, the second interlayer dielectric layer patterns 145A and the second sacrificial layer patterns 140A are etched on both sides of the third trenches T3 using line-shaped mask patterns (not shown) used as etch masks. The line-shaped mask patterns extend in the same direction as the third trenches T3. Accordingly, fourth trenches T4 are defined. A plurality of fourth trenches T4 may be arranged parallel to one another.

Next, the second sacrificial layer patterns 140A which are exposed through the fourth trenches T4 are removed. In order to remove the second sacrificial layer patterns 140A, a wet etching process using a different etching selectivity against the first and second interlayer dielectric layer patterns 105A and 145A and the first to third dielectric layers 115, 135 and 150 may be performed.

Figure 2G:
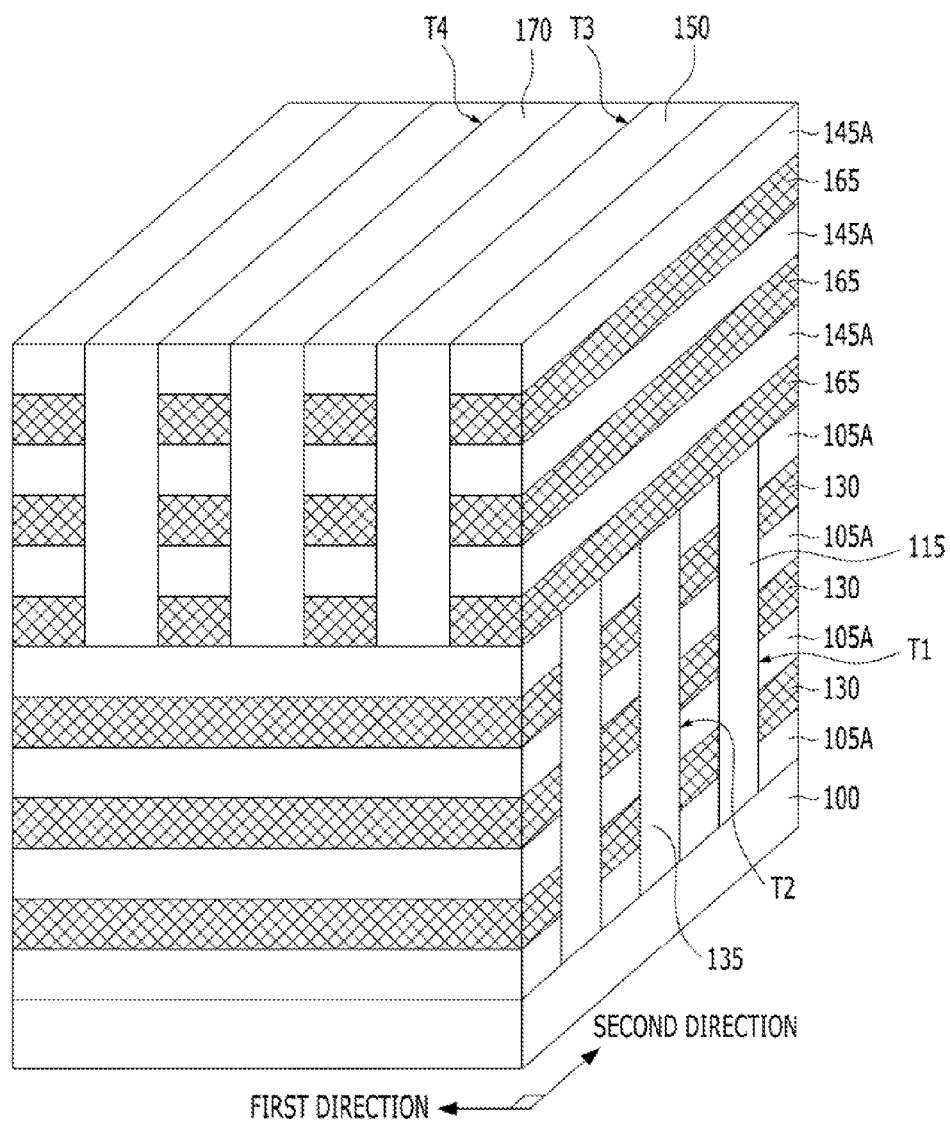

Referring to FIG. 2G, second horizontal electrodes 165 are formed in spaces where the second sacrificial layer patterns 140A are removed. The second horizontal electrodes 165 may include a conductive substance such as a metal nitride, a metal, or a doped polysilicon. The second horizontal electrodes 165 may be formed by conformally depositing a conductive substance through chemical vapor deposition (CVD) or atomic layer deposition (ALD). A conductive layer (not shown) for second horizontal electrodes is formed to fill the fourth trenches T4 including the spaces where the second sacrificial layer patterns 140A are removed. The conductive layer for second horizontal electrodes is etched until the side surfaces of the second interlayer dielectric layer patterns 145A are exposed.

Thereupon, a fourth dielectric layer 170 is formed in the fourth trenches T4. The fourth dielectric layer 170 may be formed by depositing a dielectric substance, e.g., an oxide-based substance, to fill the fourth trenches T4. Then, a planarization process such as chemical mechanical polishing (CMP) is performed until the upper surfaces of the second interlayer dielectric layer patterns 145A are exposed.

Figure 2H:
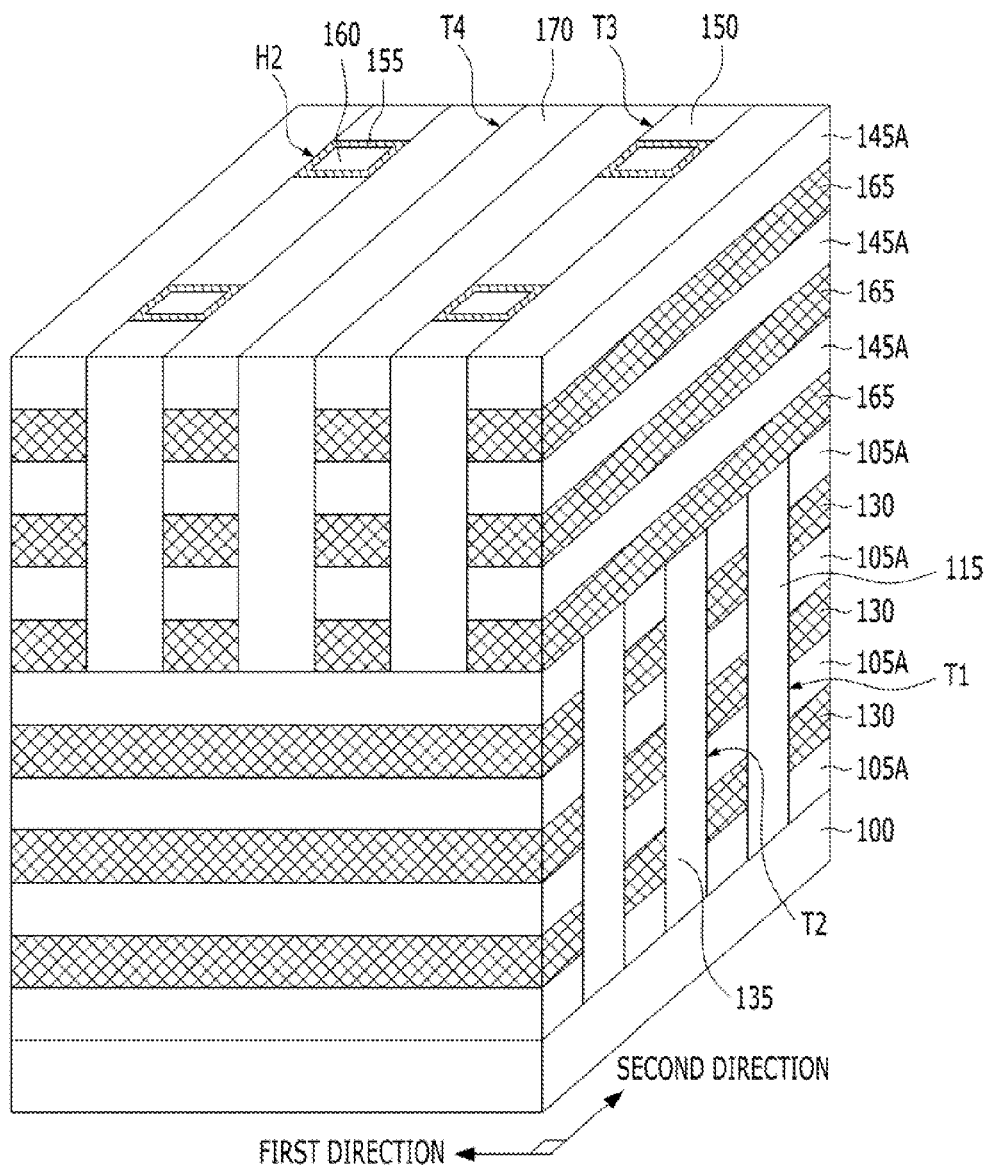

Referring to FIG. 2H, by selectively etching the third dielectric layer 150, second holes H2 are defined to expose the second horizontal electrodes 165 and the first vertical electrodes 125. A plurality of second holes H2 may be arranged in a matrix type. The cross-sections of the second holes H2 which are taken in the direction parallel to the substrate 100 may have the shape of a square, a circle, a rectangle, or an ellipse. In particular, a process margin may be sufficiently secured by defining the second holes H2 to have a width larger than that of the first holes H1 in the direction parallel to the substrate 100.

In succession, a second variable resistance layer 155 is formed on the sidewalls of the second holes H2. The second variable resistance layer 155 may include electrical resistance changed by migration of oxygen vacancies or ions or phase change of a substance. Otherwise, the second variable resistance layer 155 may include a magnetic tunnel junction (MTJ) structure having electrical resistance changed according to a magnetic field or a spin transfer torque (STT). The second variable resistance layer 155 may be formed of the same substance as the first variable resistance memory device 120.

Thereafter, second vertical electrodes 160 are formed in the second holes H2 in which the second variable resistance layer 155 is formed to connect with the first vertical electrodes 125. The second vertical electrodes 160 may include a conductive substance such as a metal nitride, a metal, or a doped polysilicon. The second vertical electrodes 160 may be formed of the same substance as the first vertical electrodes 125.

In the second embodiment, since a variable resistance layer is formed after forming horizontal electrodes, it is possible to prevent the variable resistance layer from being damaged in the course of removing sacrificial layer patterns.

Figure 3A:
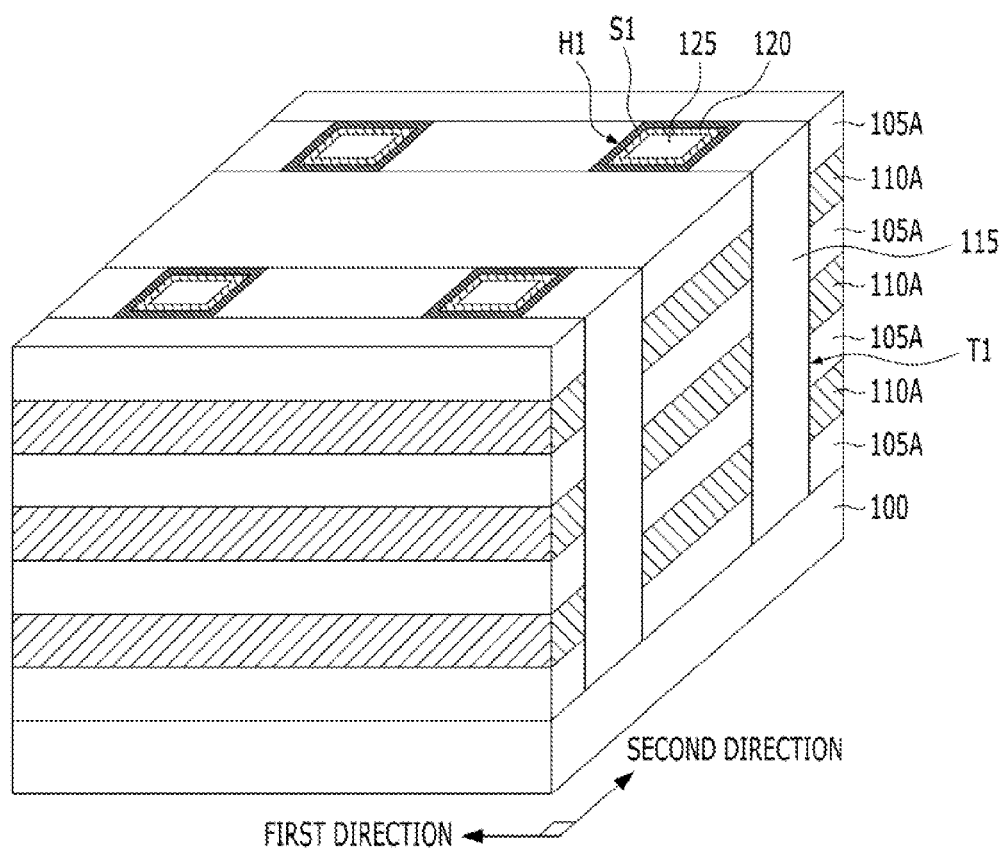
FIGS. 3A and 3B are perspective views explaining a variable resistance memory device and a method for fabricating the same in accordance with a third embodiment of the present invention.
Figure 3B:
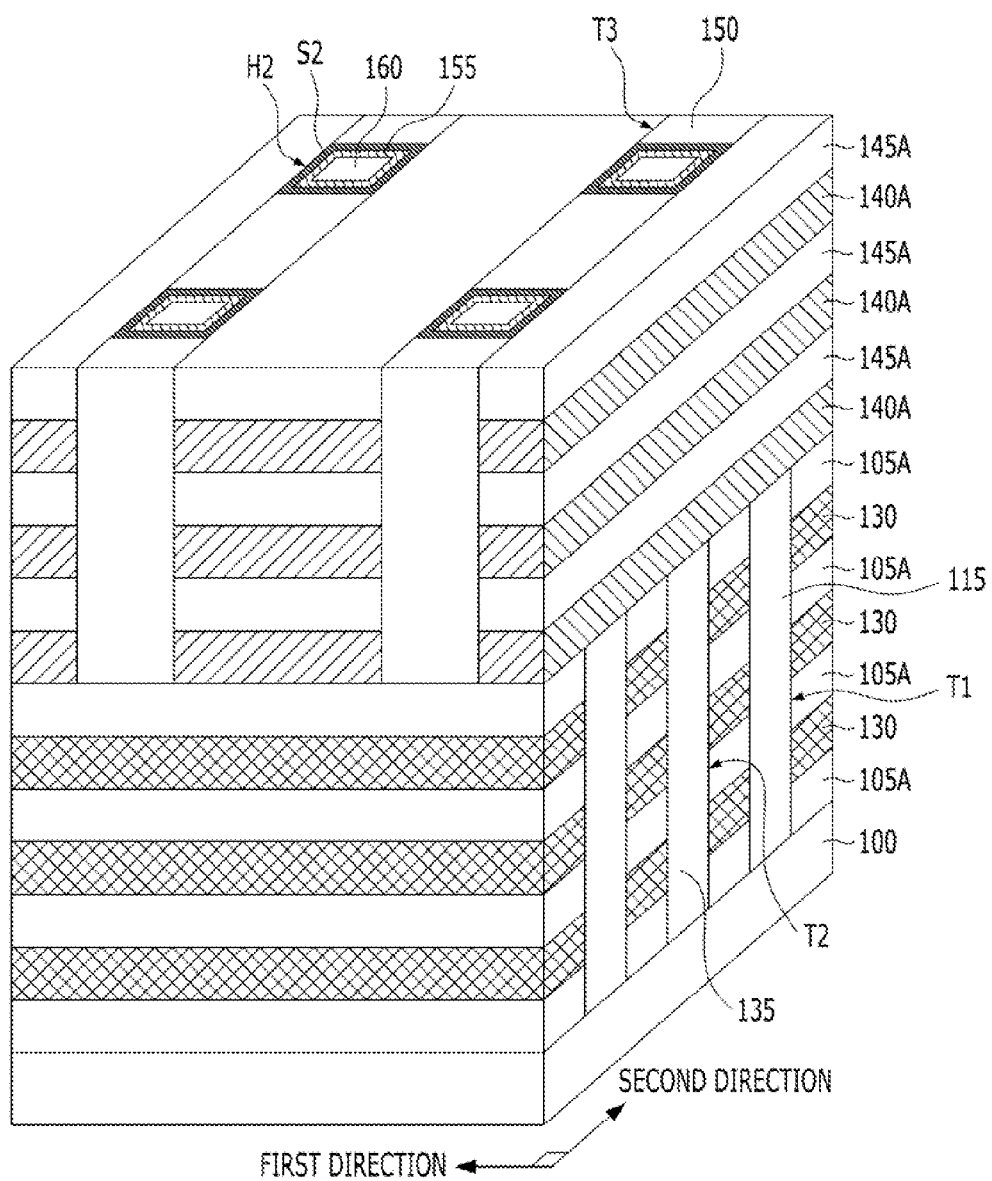

FIGS. 3A and 3B are perspective views explaining a variable resistance memory device and a method for fabricating the same in accordance with a third embodiment of the present invention. In describing the third embodiment, detailed descriptions for substantially the same component parts as the aforementioned first and second embodiments will be omitted. First, after performing the processes of FIGS. 1A and 1B of the first embodiment or the processes of FIGS. 2A and 2B of the second embodiment, the process of FIG. 3A is performed.

Referring to FIG. 3A, by selectively etching the first dielectric layer 115, first holes H1 are defined to expose the side surfaces of the first interlayer dielectric layer patterns 105A and the substrate 100. A plurality of first holes H1 may be arranged in a matrix type.

Then, first selection elements S1 and a first variable resistance layer 120 are sequentially formed on the sidewalls of the first holes H1. The first selection elements S1 may include diodes such as PN diodes using a metal oxide or silicon, Schottky diodes, and so forth. Furthermore, selection elements capable of threshold voltage switching at a voltage of a single polarity as well as a voltage of both polarities may be used. The first variable resistance layer 120 may include electrical resistance changed by migration of oxygen vacancies or ions or phase change of a substance. Otherwise, the first variable resistance layer 120 may include a magnetic tunnel junction (MTJ) structure having electrical resistance changes according to a magnetic field or a spin transfer torque (STT).

Thereafter, first vertical electrodes 125 are formed in the first holes H1 where the first variable resistance layer 120 is formed. The first vertical electrodes 125 may include a conductive substance such as a metal nitride, a metal or a doped polysilicon.

Referring to FIG. 3B, after performing the processes of FIGS. 1D to 1G of the first embodiment or the processes of FIGS. 2D to 2G of the second embodiment, by selectively etching the third dielectric layer 150, second holes H2 are defined to expose the side surfaces of the second interlayer dielectric layer patterns 145A and the first vertical electrodes 125. A plurality of second holes H2 may be arranged in a matrix type.

Then, second selection elements S2 and a second variable resistance layer 155 are sequentially formed on the sidewalls of the second holes H2. As the second selection elements S2, the same diodes as the first selection elements S1 or selection elements capable of threshold voltage switching at a voltage of both polarities may be used. The second variable resistance layer 155 may be formed of the same substance as the first variable resistance layer 120.

Thereafter, second vertical electrodes 160 are formed in the second holes H2 where the second variable resistance layer 155 is formed, to connect with the first vertical electrodes 125. The second vertical electrodes 160 may be formed of the same substance as the first vertical electrodes 125.

Next, the processes of FIGS. 1I and 1J may be performed in the same manner as the first embodiment.

The third embodiment as described above is distinguished from the first and second embodiments in that the first selection elements S1 and the second selection elements S2 are interposed between the first horizontal electrodes 130 and the first variable resistance layer 120 and between the second horizontal electrodes 165 and the second variable resistance layer 155.

Figure 4:
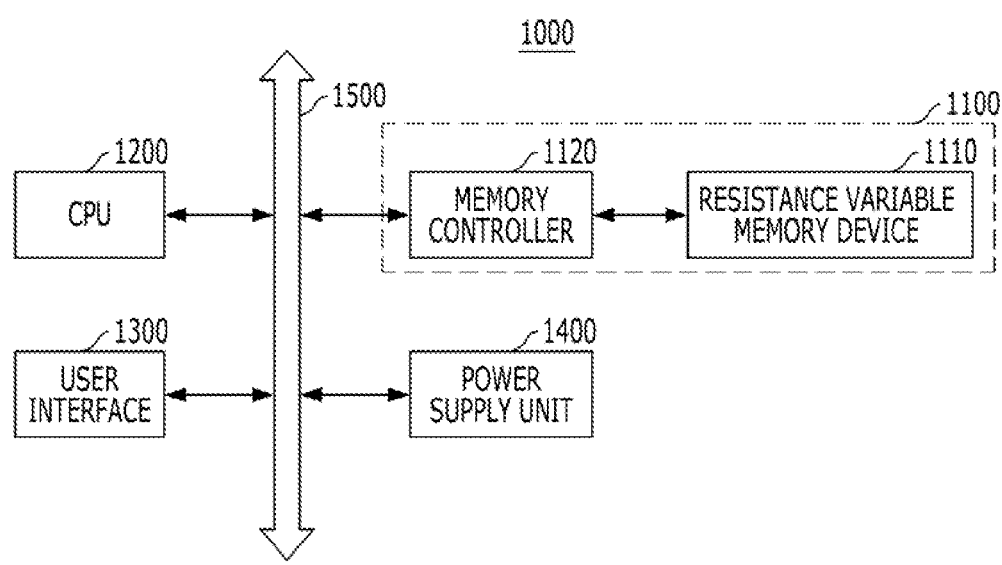
FIG. 4 is a block diagram showing an information processing system to which a variable resistance memory device according to an embodiment of the present invention is applied.

FIG. 4 is a block diagram showing an information processing system to which a variable resistance memory device according to an embodiment of the present invention is applied.

Referring to FIG. 4, an information processing system 1000 may include a memory system 1100, a central processing unit 1200, a user interface 1300 and a power supply unit 1400. A variable resistance memory device according to an embodiment of the present invention is embedded in the information processing system 1000. These component parts may carry out data communication with one another through a bus 1500.

The memory system 1100 may be constituted by a variable resistance memory device 1110 and a memory controller 1120. The data processed by the central processing unit 1200 or the data inputted through the user interface 1300 from an outside may be stored in the variable resistance memory device 1110.

Such an information processing system 1000 may constitute all kinds of electronic appliances which require storage of data. For example, the information processing system 1000 may be applied to a memory card, a solid state disk (SSD), various mobile devices such as a smart phone, and so forth.

As is apparent from the above descriptions, in the variable resistance memory device and the method for fabricating the same according to the embodiments of the present invention, vertical electrodes are commonly used so that the integration degree of memory cells may increase. The decreased number of mask processes may make fabricating processes simplify. The fabrication cost may reduce.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a variable resistance memory device, comprising:
    alternately stacking a plurality of first interlayer dielectric layers and a plurality of first sacrificial layers on a substrate;
    defining first trenches which extend across the first interlayer dielectric layers and the first sacrificial layers in one direction;
    forming a first dielectric layer in the first trenches;
    defining second trenches which extend across the first interlayer dielectric layers and the first sacrificial layers in the same direction as the first trenches, on both sides of the first trenches;
    removing the first sacrificial layers which are exposed through the second trenches;
    forming first horizontal electrodes in spaces generated by removal of the first sacrificial layers;
    selectively etching the first dielectric layer and defining first holes which expose the first horizontal electrodes and the substrate; and
    sequentially forming a first variable resistance layer and first vertical electrodes along sidewalls of the first holes.

2. The method of claim 1, wherein, after the defining of the first holes, the method further comprises:
    forming selection elements on sidewalls of the first holes.

3. The method of claim 1, wherein the first variable resistance layer is formed to have a structure in which electrical resistance changes by migration of oxygen vacancies or ions or phase change of a substance.

4. The method of claim 1, wherein the first variable resistance layer is formed to have a magnetic tunnel junction (MTJ) structure in which electrical resistance changes according to a magnetic field of a spin transfer torque (STT).

5. The method of claim 1, wherein the first sacrificial layers are formed of a substance which has an etching selectivity with respect to the first interlayer dielectric layers.

6. The method of claim 1, wherein the first holes are defined such that cross-sections of the first holes which are taken in a direction parallel to the substrate have the shape of a rectangle or an ellipse.

7. The method of claim 1, wherein, after the forming of the first vertical electrodes, the method further comprises:
    alternately stacking a plurality of second sacrificial layers and a plurality of second interlayer dielectric layers on the substrate which is formed with the first vertical electrodes;
    defining third trenches which extend across the second interlayer dielectric layers and the second sacrificial layers in a direction crossing with the first trenches;
    forming a third dielectric layer in the third trenches;
    defining fourth trenches which extend across the second interlayer dielectric layers and the second sacrificial layers in the same direction as the third trenches, on both sides of the third trenches;
    removing the second sacrificial layers which are exposed through the fourth trenches;
    forming second horizontal electrodes in spaces generated by removal of the second sacrificial layers;
    selectively etching the third dielectric layer and defining second holes which expose the second horizontal electrodes and the first vertical electrodes; and
    sequentially forming a second variable resistance layer and second vertical electrodes which are connected with the first vertical electrodes, along sidewalls of the second holes.

8. The method of claim 7, wherein the second holes are defined such that cross-sections of the second holes which are taken in a direction parallel to the substrate have the shape of a rectangle or an ellipse.

9. The method of claim 7, wherein the second holes are defined to have a width larger than the first holes when measured in the direction parallel to the substrate.

\* \* \* \* \*